United States Patent [19]
Yang

[11] Patent Number: 5,393,679
[45] Date of Patent: Feb. 28, 1995

[54] USE OF DOUBLE CHARGE IMPLANT TO IMPROVE RETROGRADE PROCESS PMOS PUNCH THROUGH VOLTAGE

[75] Inventor: Sheng-Hsing Yang, Hsinchu,

[73] Assignee: United Microelectronics Corporation, Hsinchu,

[21] Appl. No.: 222,940

[22] Filed: Apr. 5, 1994

[51] Int. Cl.⁶ ......................................... H01L 21/265
[52] U.S. Cl. ........................................ 437/34; 437/30; 437/45; 437/57
[58] Field of Search .............................. 437/34, 45, 57

[56] References Cited

U.S. PATENT DOCUMENTS

| | | | |
|---|---|---|---|
| 4,710,477 | 12/1987 | Chen | 437/34 |
| 4,717,683 | 1/1988 | Parillo | 437/57 |
| 4,761,384 | 8/1988 | Neppl et al. | 437/29 |

*Primary Examiner*—Brian E. Hearn
*Assistant Examiner*—Trung Dang

*Attorney, Agent, or Firm*—George O. Saile; Graham S. Jones, II

[57] ABSTRACT

A semiconductor CMOS device on a silicon substrate doped with an N— dopant is manufactured by a process of forming a mask upon the substrate, forming field oxide structures upon the substrate through the mask, removing the mask, forming a sacrificial layer on the surface of the substrate between the field oxide structures, forming a P-well mask on the substrate for the NMOS portion of the device, implanting dopant ions to form an NMOS retrograde P-well through the P-well mask, performing an NMOS $V_T$ first implant of ions through the P-well mask into selected regions of the the substrate, performing a second $V_T$ implant of ions into the substrate, performing a PMOS punchthrough voltage implant of ions into the substrate, forming doped polysilicon gate structures, and forming doped source/drain regions.

10 Claims, 5 Drawing Sheets

USE OF DOUBLE CHARGE IMPLANT TO IMPROVE RETROGRADE PROCESS PMOS PUNCH THROUGH VOLTAGE

BACKGROUND OF THE INVENTION

1. Field of the Invention

This invention relates to CMOS semiconductor devices and more particularly to improved dosages of dopant therein.

2. Description of Related Art

In a conventional retrograde process, an implant of a single charge of phosphorous $P^{+31}$ is employed to improve the PMOS device punchthrough voltage of the semiconductor device. However, that method limits the PMOS channel length to 1.2 $\mu$m on the wafer which is disadvantageous because the chips size would be larger.

U.S. Pat. No. 4,710,477 of Chen for "Method for Forming Latch-up Immune, Multiple Retrograde Well High Density CMOS FET" describes a double retrograde density profile at Col. 5, lines lines 26–27. The Chen patent describes a method producing a multiple P-well implant to improve latch-up, but it is not useful for the purpose of PMOS device gate length reduction.

U.S. Pat. No. 4,761,384 of Neppl et al "Forming Retrograde Twin Wells by Outdiffusion of Impurity Ions in Epitaxial Layer Followed by CMOS Device Processing" shows a method for forming retrograde twin wells. The Neppl et al patent describes a method requiring use of a P-well and N-well implant to produce a retrograde twin well for the purpose of reducing the N+ inside the P-well rule and to reduce the P+ inside the N-well rule. However, with this design the PMOS device gate length is reduced, which is not very useful. Another disadvantage of the Neppl design is that an epitaxial wafer is required for this design is expensive, adding significantly to manufacturing cost.

SUMMARY OF THE INVENTION

In accordance with this invention a semiconductor CMOS device on a silicon substrate doped with an N− dopant is manufactured by the process comprising:

a) forming a P-well mask on the substrate for the NMOS portion of the device, b) implanting dopant ions to form an NMOS retrograde P-well through the P-well mask, c) performing an NMOS first $V_T$ implant of ions into the substrate, d) removing the P-well mask and performing a second $V_T$ implant of ions into the substrate, e) performing a PMOS punchthrough voltage implant of ions into the substrate, f) forming of doped polysilicon gate structures above the substrate, and g) forming of doped source/drain regions.

In another aspect of this invention, a semiconductor CMOS device on a silicon substrate doped with an N− dopant is manufactured by the process comprising:

forming a mask upon the substrate, forming field oxide structures upon the substrate through the mask, removing the mask, forming a sacrificial layer on the surface of the substrate between the field oxide structures, forming a P-well mask on the substrate for the NMOS portion of the device, implanting dopant ions to form an NMOS retrograde P-well through the P-well mask, performing an NMOS $V_T$ first implant of ions through the P-well mask into selected regions of the the substrate, performing a second $V_T$ implant of ions into the substrate, performing a PMOS punchthrough voltage implant of ions into the substrate, forming doped polysilicon gate structures, and forming doped source/drain regions.

Preferably, the first $V_T$ implant of ions is performed with a dosage of from about $7 \times 10^{11}$ cm$^{-2}$ to about $9 \times 10^{11}$ cm$^{-2}$, with an energy within a range from about 40 keV to about 80 keV; preferably, the second $V_T$ implant of ions is performed with a dosage of from about $1 \times 10^{12}$ cm$^{-2}$ to about $3 \times 10^{12}$ cm$^{-2}$, with an energy within a range from about 40 keV to about 80 keV; and/or the PMOS punchthrough voltage implant of ions comprises a double charge with a dose from about $2.4 \times 10^{12}$ to about $4 \times 10^{12}$, with an energy within a range from about 380 keV to about 400 keV; and the retrograde implant dopant comprises $BF_2$ ions and the punchthrough implant dopant comprises $p^{31}$ $p^{+2}$ ions.

In accordance with this invention a higher dosage of dopant comprising a "double charge" of from 2.4 E 12 to about 4.0 E 12 of phosphorous ($P^{31}$) $P^{++}$ is applied to improve PMOS device punchthrough voltage for the smaller channel length, without adversely affecting the NMOS device performance.

BRIEF DESCRIPTION OF THE DRAWINGS

The foregoing and other aspects and advantages of this invention are explained and described below with reference to the accompanying drawings, in which.

DESCRIPTION OF THE PREFERRED EMBODIMENT

Figure 1:
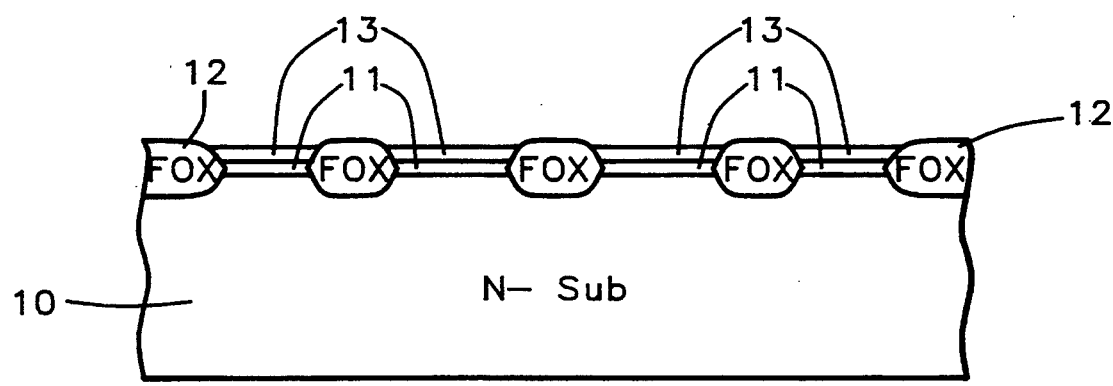
FIG. 1 illustrates the first steps of manufacture a device in accordance with the process of this invention, wherein a silicon semiconductor substrate has been doped with an N− dopant, protected with a pad oxide conventional protective layer followed by a layer of silicon nitride, and a coating with a photoresist mask followed by a field ion implant, after which the remaining photoresist layer is removed, and a field oxidation step is performed to form FOX regions.

FIG. 1 illustrates the first steps of manufacture a device in accordance with the process of this invention. A silicon semiconductor substrate 10 has been doped with an N− dopant. The doped substrate 10 was then protected with a conventional PAD oxide protective layer 11 of silicon dioxide. Protective layer 11 which has a thickness of from about 200 Å to about 500 Å, was formed over the substrate 10. Then a layer of silicon nitride 13 was deposited upon the substrate 10. Subsequently, the silicon nitride layer 13 was coated with a film of photoresist.

Then photolithography was used to expose the resist through a mask. The photoresist was then developed opening a pattern therein through which the silicon nitride layer 13 is etched opening a pattern. Through the pattern of openings in the silicon nitride layer 13 a field ion implant of arsenic with a dosage of from about $6.5 \times 10^{11}$ cm$^{-2}$ to about $1.25 \times 10^{12}$ cm$^{-2}$ with an energy within a range from about 90 keV to about 150 keV is performed. Then the remaining photoresist layer is removed.

Subsequently, a conventional field oxidation step is performed producing field oxide (FOX) structures 12.

Figure 2:
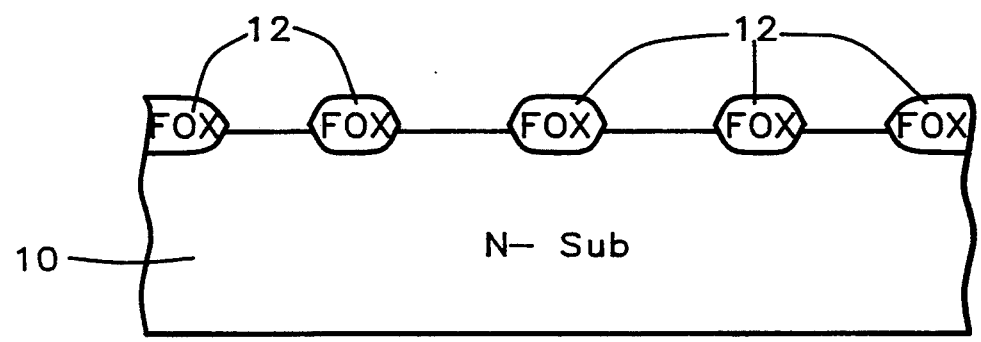
FIG. 2 shows the product of FIG. 1 after the remaining portions of silicon nitride layer is removed, and the pad oxide layer is removed.

Referring to FIG. 2, then the remaining portions of silicon nitride layer 13 is removed. Finally the pad oxide layer 11 is removed. Then, the the structure as seen in FIG. 2 has been formed.

Figure 3:
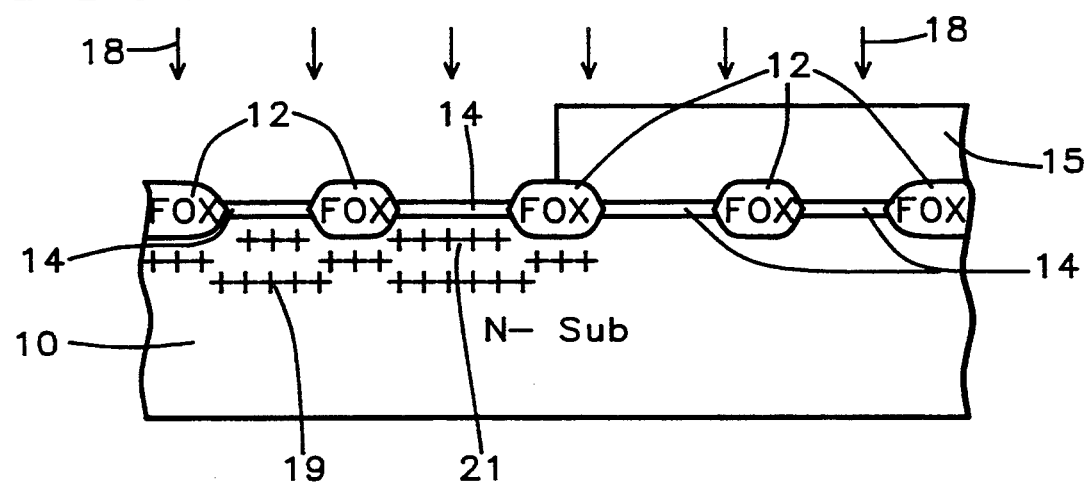
FIG. 3 shows the product of FIG. 2 after a sacrificial silicon dioxide layer was grown between the FOX structures 12, the entire structure was masked by photolithography to expose a P-well pattern with the P-well pattern ion implanted to form a retrograde P-well, followed by an NMOS $V_T$ implant (B+) of into the substrate between FOX structures.

Referring to FIG. 3, a sacrificial silicon dioxide layer 14 is grown between the FOX structures 12. The entire structure is then coated with photoresist layer 15 exposed to form a mask patterned by photolithography to expose a P-well pattern. The mask covers the P-channel portion of the device. The P-well pattern is subjected to implanting of boron B+ ions 19 at an energy greater than about 180 keV, with a dosage of from about $1 \times 10^{13}$ cm$^{-2}$ to about $2.8 \times 10^{13}$ cm$^{-2}$ with an energy within a range from about 180 keV to about 200 keV is performed to produce a retrograde P-well through the photoresist mask.

Subsequent to the retrograde implant, an NMOS $V_T$ implant (B+) of BF$_2$ ions 21 is performed into substrate 10 between FOX structures 12 with a dosage of from about $7 \times 10^{11}$ cm$^{-2}$ to about $9 \times 10^{11}$ cm$^{-2}$, with an energy within a range from about 40 keV to about 80 keV.

Figure 4:
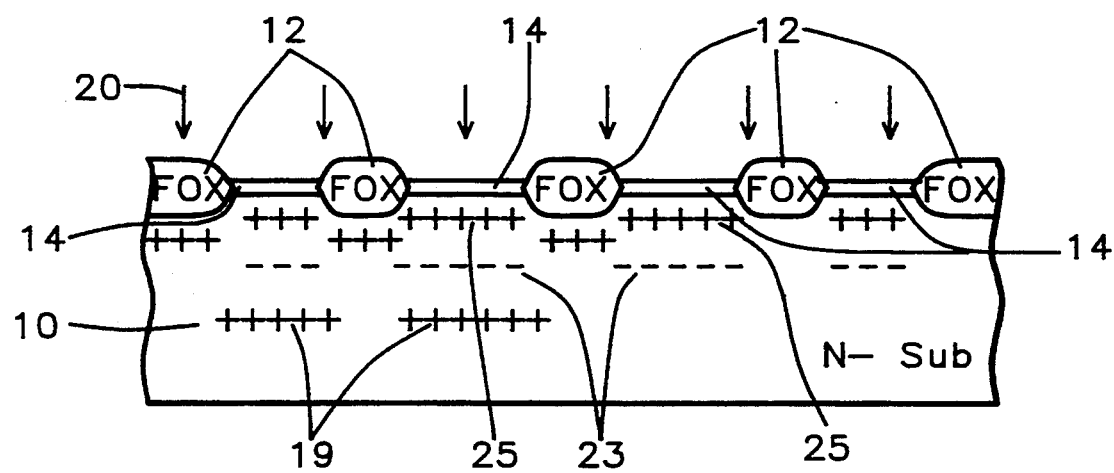
Referring to FIG. 4, the photoresist mask was removed, a $V_T$ ion implant was performed, and subsequently, a PMOS punchthrough voltage implant of ions was performed.

Referring to FIG. 4, the photoresist mask 15 is removed. At this point, a $V_T$ ion implant of (BF$_2$) ions 25 is performed with a dosage of from about $1 \times 10^{12}$ cm$^{-2}$ to about $3 \times 10^{12}$ cm$^{-2}$, with an energy within a range from about 40 keV to about 80 keV.

A PMOS punchthrough-voltage implant of ions 23 in a double charge P$^{+2}$ of P$^{31}$ with a dose from about $2.4 \times 10^{12}$ to about $4.0 \times 10^{12}$, with an energy within a range from about 380 keV to about 400 keV.

Figure 5:
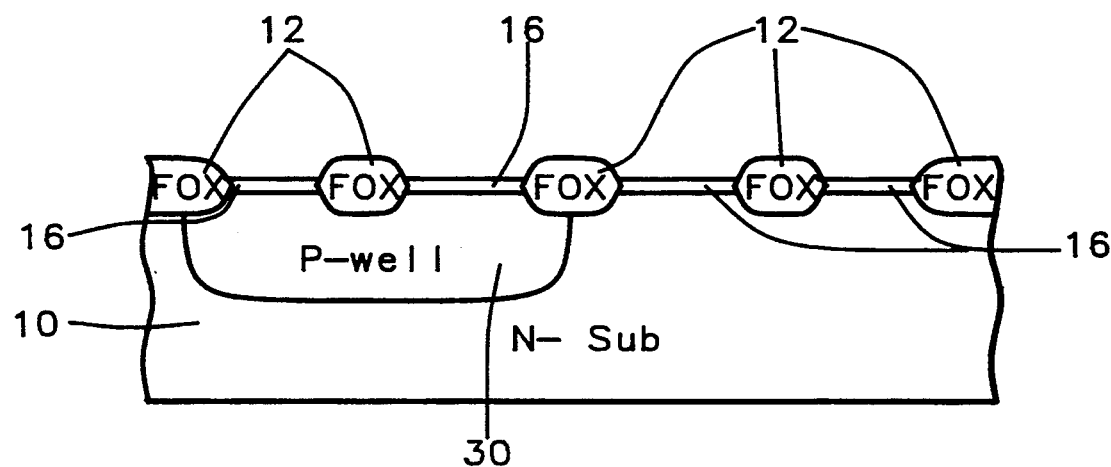
Referring to FIG. 5 the sacrificial silicon dioxide layer was removed, and a standard gate oxide layer was formed and the ions implanted previously were activated, by heating to between about 900° C. and about 950° C. for from about 40 minutes to about 80 minutes.

Next, referring to FIG. 5 the sacrificial silicon dioxide layer 14 has been removed preferably by the process of hydrogen fluoride (HF) solution.

A standard gate oxide layer 16 is formed by oxidation of the exposed silicon substrate 10 doped as above. Next, the ions implanted previously are activated by heating to between about 900° C. and about 950° C. for from about 40 minutes to about 80 minutes.

Figure 6:
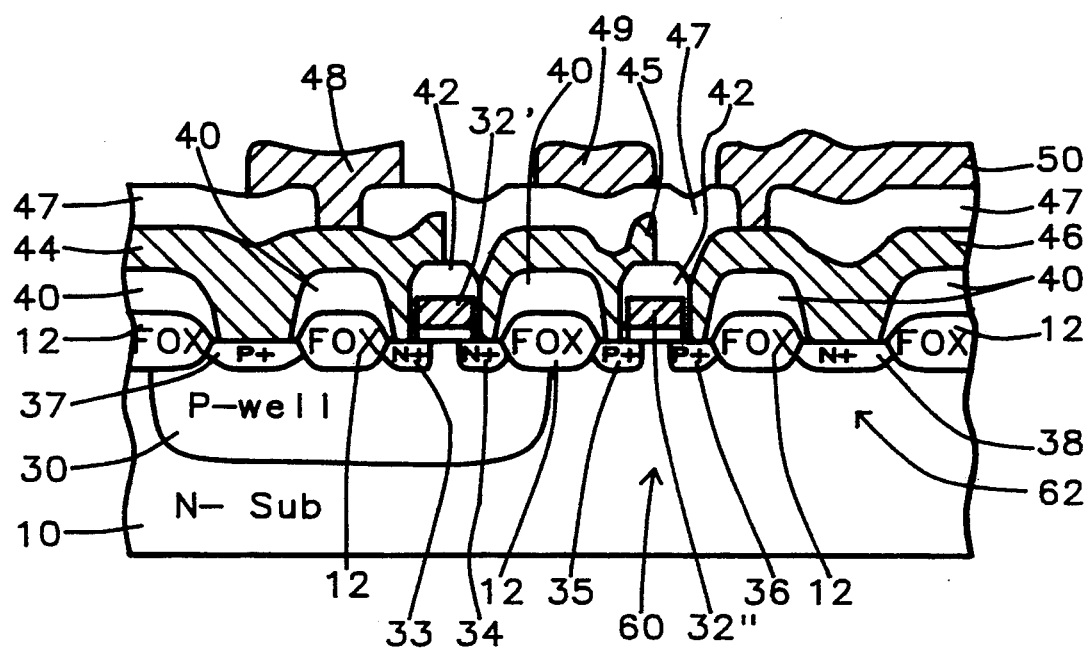
Referring to FIG. 6 a control gate polysilicon 1 layer was deposited and formed into control gates, and S/D N+ regions in a P-well forming an NMOS device, and S/D P+ regions forming a PMOS device as well as a P+ doped region for metal contact and a N+ doped region for metal contact. A patterned dielectric layer, a metal layer 1 deposited upon the dielectric layer a metal conductors extending through the dielectric layer into contact with doped regions, a second layer of dielectric deposited and patterned and a metal layer 2 deposited thereon forming metal conductors connected to other conductors.

Referring to FIG. 6 a blanket layer forming gates 32', 32" of control gate polysilicon 1 in accordance with the state of the art has been deposited over gate oxide layer 16 and FOX regions 12 by low pressure chemical vapor deposition (LPCVD). N+ doping of polysilicon 1 layer 32 is accomplished by the process of POCl$_3$/N$_2$/O$_2$ doping. Then the polysilicon 1 layer 32, 32' was coated with photoresist, which is then exposed to a polysilicon 1 photolithographic mask. Using the mask layer 32, 32' is subjected to polysilicon etching using a system such as a LAM 490 unit manufactured by LAM Research comprising a plasma etching chamber to etch the polysilicon producing control electrodes 32' and 32". Then the photoresist mask is removed.

Referring again to FIG. 6, S/D N+ regions 33 and 34 in P-well 30 form an NMOS device, S/D P+ regions 35 and 36 form a PMOS device. P+ doped region 37 for metal contact 44 and N+ doped region 38 for metal contact 46 are also formed contemporaneously, as is well known by those skilled in the art.

A first dielectric layer 40 is deposited and patterned and then metal layer 1 is deposited upon dielectric layer 40 forming metal conductors 44, 45, and 46. Metal conductor 44 extends through dielectric layer 40 into contact with P+ region 37. Metal conductor 46 extends through dielectric layer 40 in contact with N region 38, and metal conductor 45 extends through dielectric 40 into contact with N+ region 34 of the NMOS transistor and into contact with P+ region 35 of the PMOS transistor of the CMOS device.

A second layer of dielectric 47 deposited and patterned and then metal layer 2 is deposited upon dielectric layer 47 forming metal conductors 48, 49 and 50. Metal conductor 48 extends through dielectric layer 47 into contact with metal conductor 44. Metal conductor 50 extends through dielectric 47 into contact with metal conductor 46.

Metal conductor 49 is connected to metal conductor 45 by means not shown for convenience of illustration.

Figure 7:
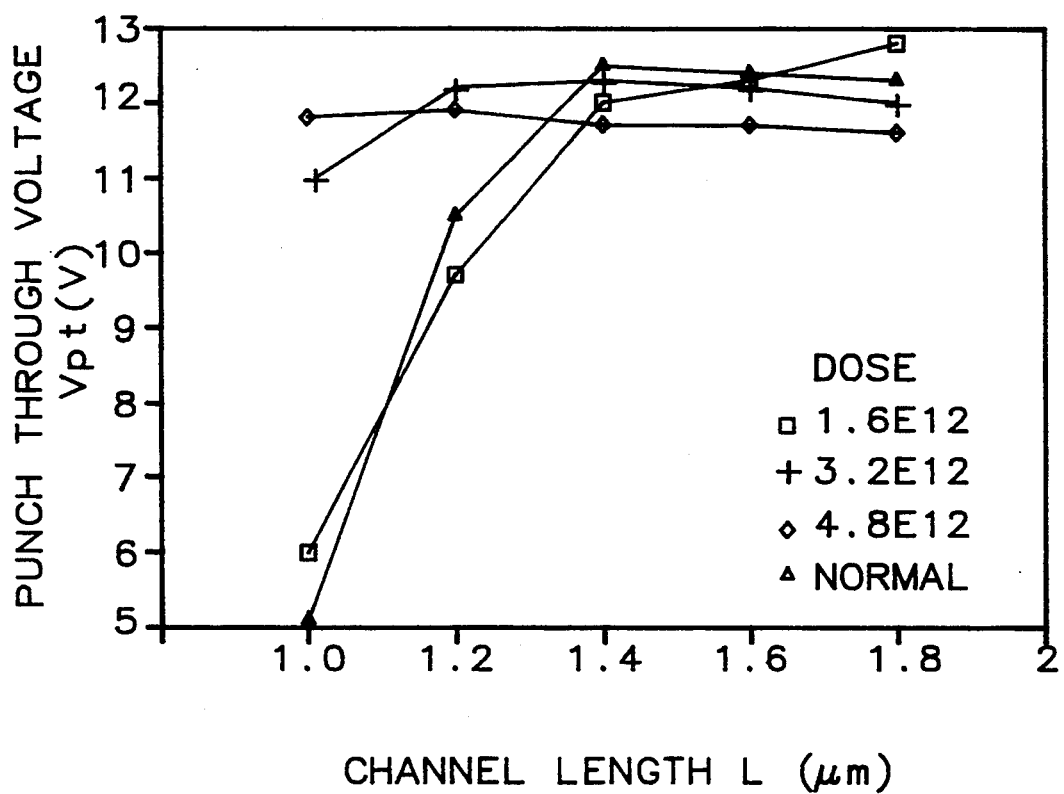
FIG. 7 is a graph of the punch through Voltage ($V_{PT}(V)$) vs Channel Length ($\mu$m) for a PMOS device with a double charge of phosphorous dopant compared with a normal dose with a single charge of phosphorus.

FIG. 7 is a graph of the punch through Voltage ($V_{PT}(V)$) vs Channel Length ($\mu$m) for a PMOS device with a double charge of phosphorous dopant applied at 390 keV compared with a normal dose with a single charge of phosphorus. The three doses of double charge phosphorus which are applied are 1.6E12, 3.2E12 and 4.8E12.

Figure 8:
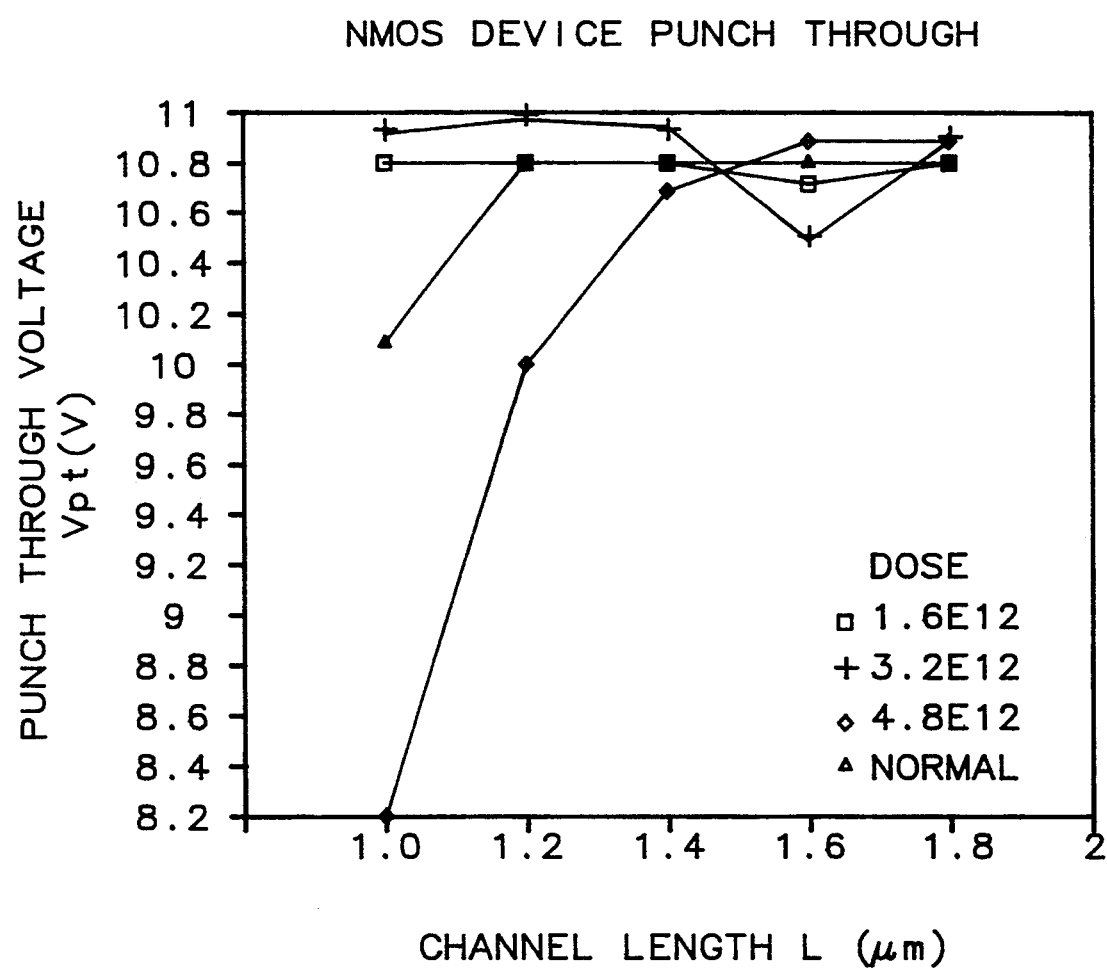
FIG. 8 is a graph of the punch through Voltage ($V_{PT}(V)$) vs Channel Length ($\mu$m) for an NMOS device with a double charge of phosphorous dopant compared with a normal dose with a single charge of phosphorus.

FIG. 8 is a graph of the punch through Voltage ($V_{PT}(V)$) vs Channel Length ($\mu$m) for an NMOS device with a double charge of phosphorous dopant applied at 390 keV compared with a normal dose with a single charge of phosphorus. The three doses of double charge phosphorus, which are applied, are 1.6E12, 3.2E12 and 4.8E12. A high dosage of 4.8E12 is shown applied without a photoresist mask to blockout the dopant for this NMOS device. If there were a photoresist mask to block out the dosage, there would not be a problem as seen at the Channel Length of 1.0 $\mu$m.

An optimum blanket dose is shown by the "+" curve for 3.2E12 which gives a relatively high punch through voltage of about 11 Volts for both N and P devices as can be seen by reference to FIGS. 7 and 8.

While this invention has been described in terms of the above specific embodiment(s), those skilled in the art will recognize that the invention can be practiced with modifications within the spirit and scope of the appended claims, i.e. that changes can be made in form and detail, without departing from the spirit and scope of the invention. Accordingly all such changes come within the purview of the present invention and the invention encompasses the subject matter of the claims which follow.

Having thus described the invention, what is claimed as new and desirable to be secured by Letters Patent is as follows:

1. A method of manufacture of a semiconductor CMOS device on a silicon substrate doped with an N− dopant comprising:
    a) forming a P-well mask on said substrate for the NMOS portion of said device,
    b) implanting dopant ions to form an NMOS retrograde P-well through said P-well mask,
    c) performing an NMOS first $V_T$ implant of ions into said substrate,
    d) removing said P-well mask and performing a second $V_T$ implant of ions into said substrate,
    e) performing a PMOS punchthrough voltage implant of ions into said substrate,
    f) forming of doped polysilicon gate structures above said substrate, and
    g) forming of doped source/drain regions.

2. A method in accordance with claim 1 wherein said first $V_T$ implant of ions is performed with a dosage of from about $7 \times 10^{11}$ cm$^{-2}$ to about $9 \times 10^{11}$ cm$^{-2}$, with an energy within a range from about 40 keV to about 80 keV.

3. A method in accordance with claim 2 wherein said second $V_T$ implant of ions is performed with a dosage of from about $1 \times 10^{12}$ cm$^{-2}$ to about $3 \times 10^{12}$ cm$^{-2}$, with an energy within a range from about 40 keV to about 80 keV.

4. A method in accordance with claim 3 wherein said PMOS punchthrough voltage implant of ions comprises a double charge with a dose from about $2.4 \times 10^{12}$ to about $4 \times 10^{12}$, with an energy within a range from about 380 keV to about 400 keV.

5. A method in accordance with claim 4 wherein said retrograde implant dopant comprises $BF_2^+$ ions and said punchthrough implant dopant comprises $^{31}P^{+2}$ ions.

6. A method of manufacture of a semiconductor CMOS device on a silicon substrate doped with an N− dopant comprising:
    a) forming a mask upon said substrate,
    b) forming field oxide structures upon said substrate through said mask, removing said mask,
    c) forming a sacrificial layer on the surface of said substrate between said field oxide structures,
    d) forming a P-well mask on said substrate for the NMOS portion of said device,
    e) implanting dopant ions to form an NMOS retrograde P-well through said P-well mask,
    f) performing an NMOS $V_T$ first implant of ions through said P-well mask into selected regions of said said substrate,
    g) performing a second $V_T$ implant of ions into said substrate,
    h) performing a PMOS punchthrough voltage implant of ions into said substrate,
    i) forming doped polysilicon gate structures, and
    j) forming doped source/drain regions.

7. A method in accordance with claim 6 wherein said first $V_T$ implant of ions is performed with a dosage of from about $7 \times 10^{11}$ cm$^{-2}$ to about $9 \times 10^{11}$ cm$^{-2}$, with an energy within a range from about 40 keV to about 80 keV.

8. A method in accordance with claim 7 wherein said second $V_T$ implant of ions is performed with a dosage of from about $1 \times 10^{12}$ cm$^{-2}$ to about $3 \times 10^{12}$ cm$^{-2}$ with an energy within a range from about 40 keV to about 80 keV.

9. A method in accordance with claim 8 wherein said PMOS punchthrough voltage implant of ions comprises a double charge with a dose from about $2.4 \times 10^{12}$ to about $4 \times 10^{12}$, with an energy within a range from about 380 keV to about 400 keV.

10. A method in accordance with claim 9 wherein said retrograde implant dopant comprises $BF_2^+$ ions and said punchthrough implant dopant comprises $^{31}P^{+2}$ ions.

* * * * *